United States Patent
Prodić et al.

(10) Patent No.: US 7,710,209 B2
(45) Date of Patent: May 4, 2010

(54) DIGITAL PULSE FREQUENCY/PULSE AMPLITUDE (DPFM/DPAM) CONTROLLER FOR LOW-POWER SWITCHING-POWER SUPPLIES

(75) Inventors: Aleksandar Prodić, Toronto (CA); Kun Wang, Berkeley, CA (US); Amir Parayandeh, North York (CA)

(73) Assignee: Exar Corporation, Fremont, CA (US)

( * ) Notice: Subject to any disclaimer, the term of this patent is extended or adjusted under 35 U.S.C. 154(b) by 182 days.

(21) Appl. No.: 12/034,573

(22) Filed: Feb. 20, 2008

(65) Prior Publication Data

US 2008/0225938 A1 Sep. 18, 2008

Related U.S. Application Data

(60) Provisional application No. 60/895,386, filed on Mar. 16, 2007.

(51) Int. Cl.
*H03K 3/03* (2006.01)
(52) U.S. Cl. ............... 331/57; 327/261; 327/263
(58) Field of Classification Search ............ 331/57; 327/261, 263; 323/283; 713/322
See application file for complete search history.

(56) References Cited

U.S. PATENT DOCUMENTS

| | | | |
|---|---|---|---|
| 4,871,979 A | 10/1989 | Shearer et al. | |
| 4,912,340 A | 3/1990 | Wilcox et al. | |
| 5,119,045 A * | 6/1992 | Sato | 332/109 |
| 5,317,219 A * | 5/1994 | Lupi et al. | 327/262 |
| 5,444,405 A * | 8/1995 | Truong et al. | 327/239 |
| 5,638,016 A * | 6/1997 | Eitrheim | 327/175 |
| 6,023,190 A * | 2/2000 | Wada | 327/540 |
| 6,546,048 B1 * | 4/2003 | Ichiba et al. | 375/238 |
| 6,560,716 B1 | 5/2003 | Gasparik et al. | |
| 6,798,248 B2 * | 9/2004 | Hazucha et al. | 326/93 |
| 6,859,744 B2 * | 2/2005 | Giger | 702/75 |
| 7,161,398 B2 | 1/2007 | Park et al. | |
| 2001/0055319 A1 | 12/2001 | Quigley et al. | |
| 2002/0097592 A1 * | 7/2002 | Komurasaki et al. | 363/157 |
| 2004/0095122 A1 * | 5/2004 | Chapuis | 323/283 |
| 2004/0263266 A1 * | 12/2004 | Rosenbaum et al. | 331/57 |
| 2006/0227861 A1 * | 10/2006 | Maksimovic et al. | 375/238 |

OTHER PUBLICATIONS

International Search Report for PCT/US2008/057088, dated Jun. 19, 2008, 8 pages.

* cited by examiner

*Primary Examiner*—Joseph Chang
*Assistant Examiner*—Jeffrey Shin
(74) *Attorney, Agent, or Firm*—Fliesler Meyer LLP

(57) ABSTRACT

A digital controller for dc-dc switching converters can operate under light load conditions. The controller can be suitable for the use in switch-mode power supplies providing regulated output voltage for handheld devices and other low-power electronics. To create long time intervals, compared to the propagation time of digital logic a DPFM/DPAM can use a ring oscillator with two sets of delay cells and two signals racing around the ring.

18 Claims, 4 Drawing Sheets

DIGITAL PULSE FREQUENCY/PULSE AMPLITUDE (DPFM/DPAM) CONTROLLER FOR LOW-POWER SWITCHING-POWER SUPPLIES

CLAIM OF PRIORITY

This application claims priority from the following co-pending application, which is hereby incorporated in its entirety: U.S. Provisional Application No. 60/895,386 entitled: "DIGITAL PULSE FREQUENCY/PULSE AMPLITUDE (DPFM/DPAM) CONTROLLER FOR LOW-POWER SWITCHING-POWER SUPPLIES", by Aleksandar Prodić, et al., filed Mar. 16, 2007,

BACKGROUND OF THE INVENTION

Digital control of low-power switching converters allows for numerous benefits including the ability to use digital design tools, flexibility in transferring to different implementation technology, and low sensitivity on external influences.

However, in battery-powered handheld devices, such as cell phones, digital still cameras (DSC), and personal data assistants (PDAs), analog controlled dc-dc switching converters are predominantly used. Among the main obstacles for successful digital implementation are lower switching frequency, compared to analog solutions, and the absence of low-power digital architectures that can support pulse-frequency modulation (PFM). The PFM results in significant efficiency improvement when the output load of a switch-mode power supply (SMPS) is light. In the handheld devices, to extend the battery life, the PFM is usually used when the supplied devices perform simple processing tasks or operate in stand-by mode.

In recent publications several low-power solutions that either support only digital pulse-width modulation control or combine a digital-pulse width modulator (DPWM) and an analog PFM have been presented.

The problem with analog implementation is that the analog controllers require relatively long design process and need to be almost completely redesigned each time implementation technology changes. As such, they are not suitable for monolithic integration with fast changing digital hardware, on which the majority of portable devices are based. Moreover, in the latest CMOS processes not all functional blocks of analog controllers can be implemented due to very limited supply voltages.

On the other hand, some DPFM are not suitable for low power switching converters either. To create a pulse-frequency modulated (PFM) signal, often characterized with short on and long off time intervals, some realizations use a high frequency clock and employs power-inefficient counters which make them unsuitable for low-power applications, where the overall efficiency of the SMPS is significantly affected by the power consumption of the controller.

DETAILED DESCRIPTION

One challenge in designing a low-power digital pulse frequency modulator (DPFM) is the creation of long time intervals using very fast digital logic. Since the switching periods of SMPS operating in DPFM are several orders of magnitude larger than the propagation times of modern digital circuits, direct implementation of solutions used in DPWM architectures is impractical. Conventional ring oscillators would require several thousands of delay cells and huge on-chip area. On the other hand, counter-based DPFM architectures consume significant amount of power, especially when a large range of frequencies is required.

Some embodiments described below include a low-power digital pulse-frequency modulation/pulse-amplitude controller architecture that offers a solution for the previously mentioned problems and has the following unique characteristics.

The DPFM/DPAM controller can be fully realized using digital logic, allowing its implementation in the latest CMOS processes;

The DPFM/DPAM controller takes very small amount of power having a negligible effect on the overall SMPS efficiency;

The DPFM/DPAM can be implemented on a very small silicon area allowing economic implementation of the controller. This feature is extremely important in cost-sensitive portable applications.

Besides the operation as a pulse-frequency modulator, the DPFM/DPAM controller can also operate in a mode where both the switching frequency and transistor on-time are simultaneously changed to further optimize converter efficiency. This feature is not characteristic for other low-power control solutions.

Figure 1:
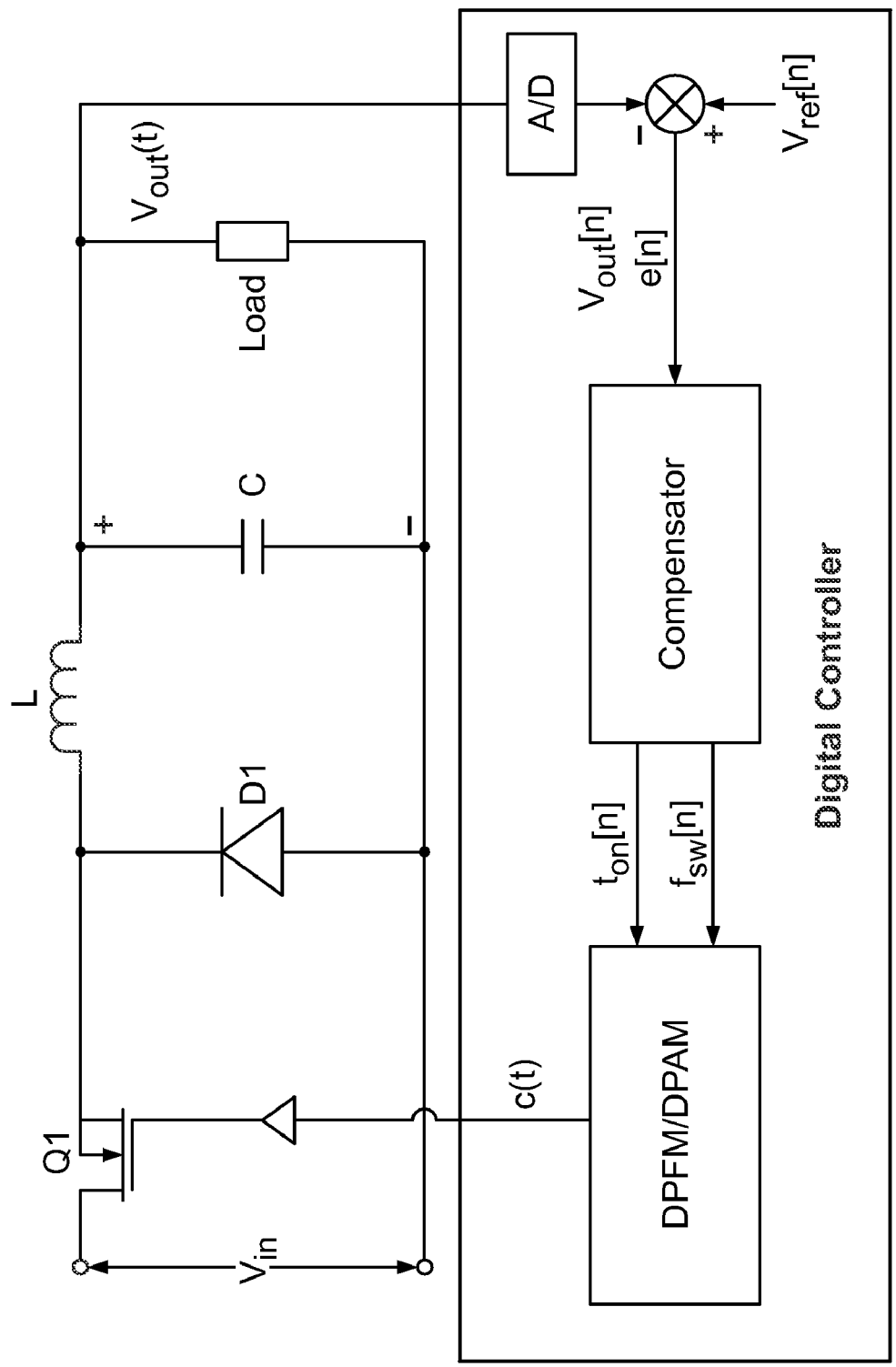
FIG. 1 illustrates a buck converter regulated by a DPFM/DPAM controller.

A buck converter regulated by a DPFM/DPAM controller is shown in FIG. 1. This controller can operate as a conventional PFM system where the on-time of the transistor $Q_1$ is kept constant, while the switching frequency is changing, depending on the output load. At very light loads the switching frequency $f_{sw}=1/T_{sw}$ is low resulting in effectively small duty ratio value $D=t_{on}/T_{sw}$ and a slow transfer of the energy from the input source to the output. As the load increases the transistor switches more often providing more energy for the load.

In this specific implementation the control over the switching frequency is performed in a digital manner. The output voltage $v_{out}(t)$ is converted in its digital equivalent $v_{out}[n]$ using an analog-to-digital converter (A/D) and compared with the desired reference $V_{ref}[n]$. The result of the comparison is a digital error signal e[n], whose value is positive if the output is smaller and negative when the regulated voltage exceeds the reference. The error signal is then processed by the compensator. The main task of this block is to create $f_{sw}[n]$ control signal which, through the DPFM/DPAM, regulates the switching frequency of the converter, in accordance with the following discrete-time control law:

$$f_{sw}[n]=f_{sw}[n-1]+a_{sw}e[n] \quad (1)$$

where $f_{sw}[n]$ is the current value of the control signal, $f_{sw}[n-1]$ is the previous value of the control signal one switching cycle before and $a_{sw}$ is a constant selected to provide stable converter operation. In this specific implementation the discrete-time control law was implemented with a compensator utilizing look-up tables. Compensator realization based on multiplier is also possible.

It can be seen that a negative value of e[n] causes the switching frequency to decrease and when the error is positive the frequency increases. In addition, as described in following sections, this structure allows the transistor's on-time to be dynamically changed, through $t_{on}[n]$, setting the optimal $t_{on}$ and $f_{sw}[n]$ for any given operating point. In PFM operation dynamic change of $t_{on}$ time results in the dynamic change of the peak value of the inductor current, i.e. its amplitude, hence both amplitude and frequency can be changed. For that reason, the presented architecture is named digital pulse-frequency/pulse-amplitude modulator.

One embodiment of the present invention is a digital modulator 200 including a delay line 202 that sets the time on of an output signal of the digital modulator 200; and circuitry 204 to set the period of the output signal of the digital modulator 200. The circuitry can include a ring oscillator 206 with slow delay cells 210 to use to set a positive edge of a pulse through the ring oscillator and fast delay cells 212 to set a negative edge of the pulse through the ring oscillator. The pulse width can narrow over time within the period.

The ring oscillator can allow for extended output periods for the digital modulator. Additionally, the speed of the pulse narrowing in the ring oscillator 206 can be adjustable to adjust the period. For example, the closer the slow delay is to the fast delay, the longer the output period.

The delay of at least one of the slow delay or fast delay cells can be adjustable to adjust the period. In one embodiment, the delay of the slow delay cells is adjustable to adjust the period.

The delay line 202 can be adjustable to adjust the time on of the output signals of the digital modulator.

The circuitry 204 can include another delay line 216 which can set the initial pulse width going into the ring oscillator 206. The delay in this another delay line 216 can be adjustable.

The circuitry can include an end-of-race detector 214 that detects the end of the period and outputs a clk signal. The ring oscillator 206 can include SR latches connected to the fast and slow delay cells 212 and 210.

The digital modulator can be a DPFM or a DPFM/DPAM. The signal-race based DPFM/DPAM architecture shown in FIG. 2 allows creation of very long time intervals using fast digital logic and can be implemented with low power hardware. The DPFM operation can be based on the race of two signals around a ring oscillator where one signal starts first and the second signal, which propagates a little bit faster, starts a little bit later. Once the faster signal catches the first one the race is over. The period of the DPFM signal can be defined by the time difference between the start of the first signal and the end of the race. It should be noted that the duration of the race, i.e. switching period, is proportional to time spacing between the two signals and inversely proportional to the speed difference of the two signals, i.e. time delay of digital logic.

In one embodiment, four major functional blocks are used: two digitally programmable delay lines 216 and 202, a digital block named End of Race detector 214 (EoR), and a ring oscillator 206 that can comprises SR latches 220 and two sets of delay cells 210 and 212. In one embodiment, the cells 210 setting the SR latches are slower and programmable and inverting delay cells 212 have constant propagation time, which is smaller than that of the slow cells. The embodiment of FIG. 2 has 3 digital inputs and start signal. The inputs $f_{sw}[n]$ and $f_{pf}[n]$ can change the switching frequency and the range of the range of frequencies over which this circuit operates, respectively. The third input, $t_{on}[n]$ can be used to control turn-on time of the transistor $Q_1$.

An exemplary operation of an exemplary circuit is described below. The initial state of all the SR latches is zero. When a short-lasting start signal occurs two pulses are created a signal p(t) at the output of the programmable delay line, whose duration is inversely proportional to $f_{sw}[n]$ and signal c(t) that is used as the turn-on signal for the transistor $Q_1$. The duration of this signal depends on the control value $t_{on}[n]$.

Figure 2:
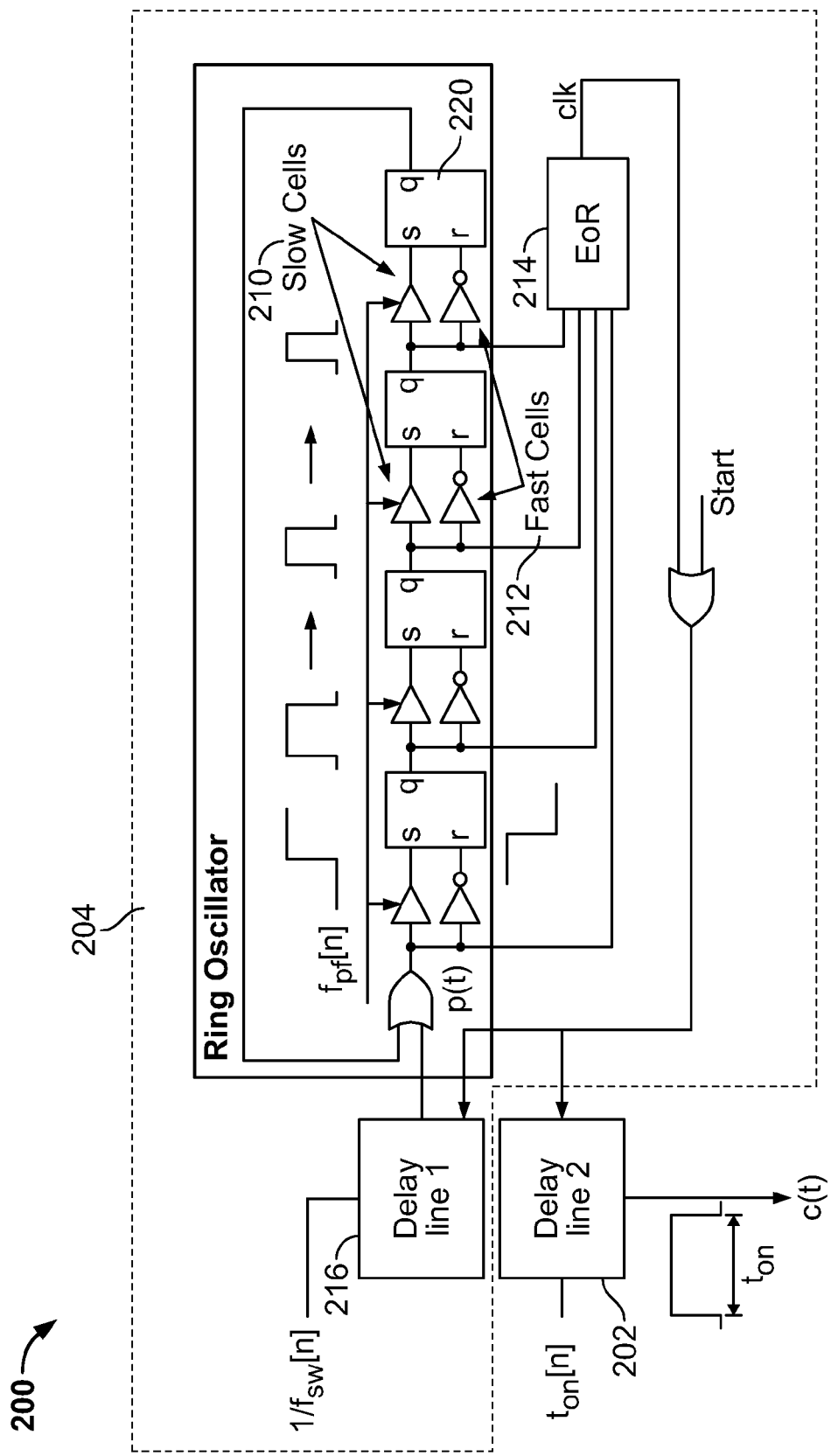
FIG. 2 illustrates a digital modulator of one embodiment of the present invention.

The positive edge of p(t) sets the first SR latch of the ring to high. In turn, the output of the first SR latch will set the second SR latch, and the process of moving the rising edge through the ring oscillator will continue. This is illustrated in FIG. 2 as a positive edge propagating on the upper track. When the negative edge of the p(t) occurs, the first latch will be reset to zero after being previously set by the positive edge. The transition of the first SR latch from high to low will reset the output of the second latch and, in the same manner the second latch will reset the third. This propagation of the negative edge will continue through the ring. It is shown as a negative edge going down the reset line. Hence, the positive and negative edge will start to chase each other around the SR latch ring. Because the delay of the set delay block is made to be slightly larger, after some time the negative edge will catch up the positive edge and all SR latches will be set to zero. This time instance is indicated with the end of the race detector (EoR) that creates a short clk pulse. The clk pulse is used to trigger both delay lines again and initiate the new racing circle.

The switching frequency of this DPFM can be controlled by changing the time distance between the rising edge and falling edges of p(t). The longer the distance between the edges is, the lower the switching frequency is. To provide additional adjustment of switching frequency $f_{pf}[n]$ signal is used. It sets the difference in speed between the cells and in that way regulates the range of switching frequencies. The smaller the difference between propagation times is the longer the race is. This system can be used for efficiency optimization, by selecting $t_{on}$ time using delay line 202, that for a given condition in the circuit always results in the minimum sum of the switching and conduction losses.

Slow digitally programmable delay cells can be implemented in multiple ways such as all-digital blocks or as digitally programmable current starved delay cells, which are more suitable for application-specific IC design.

Based on the diagrams shown in FIGS. 1 and 2 an FPGA-based experimental controller was built around a buck converter. In addition, an application specific IC was designed and simulated.

Figure 3:
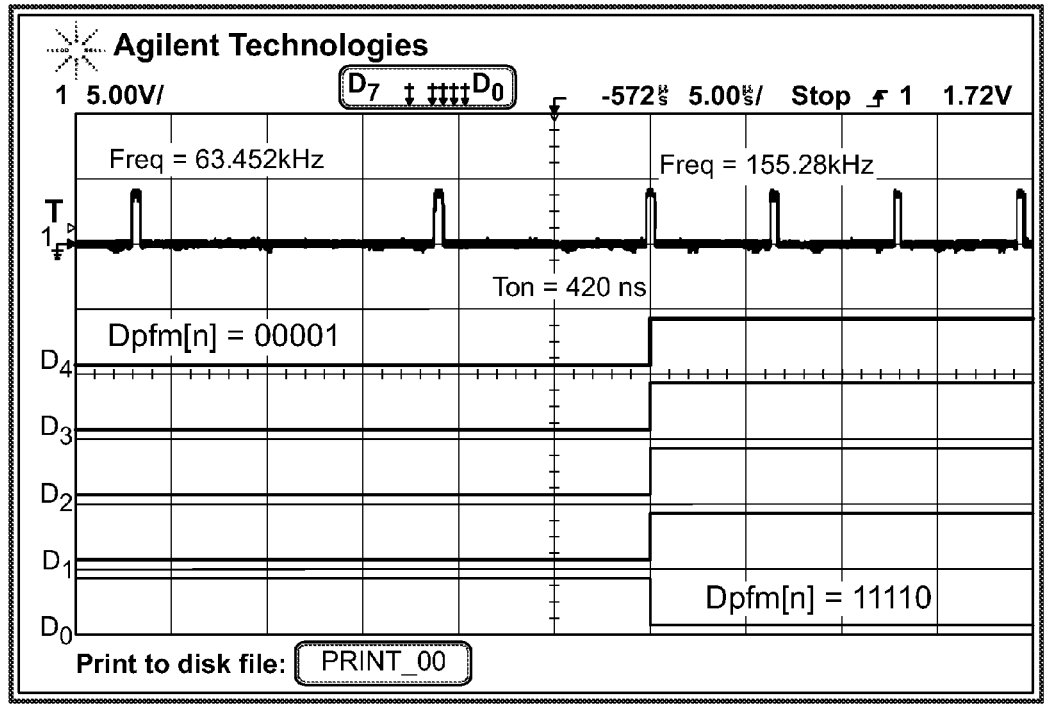
FIGS. 3-4 illustrate operation of a digital controller of one embodiment of the present invention.
Figure 4:
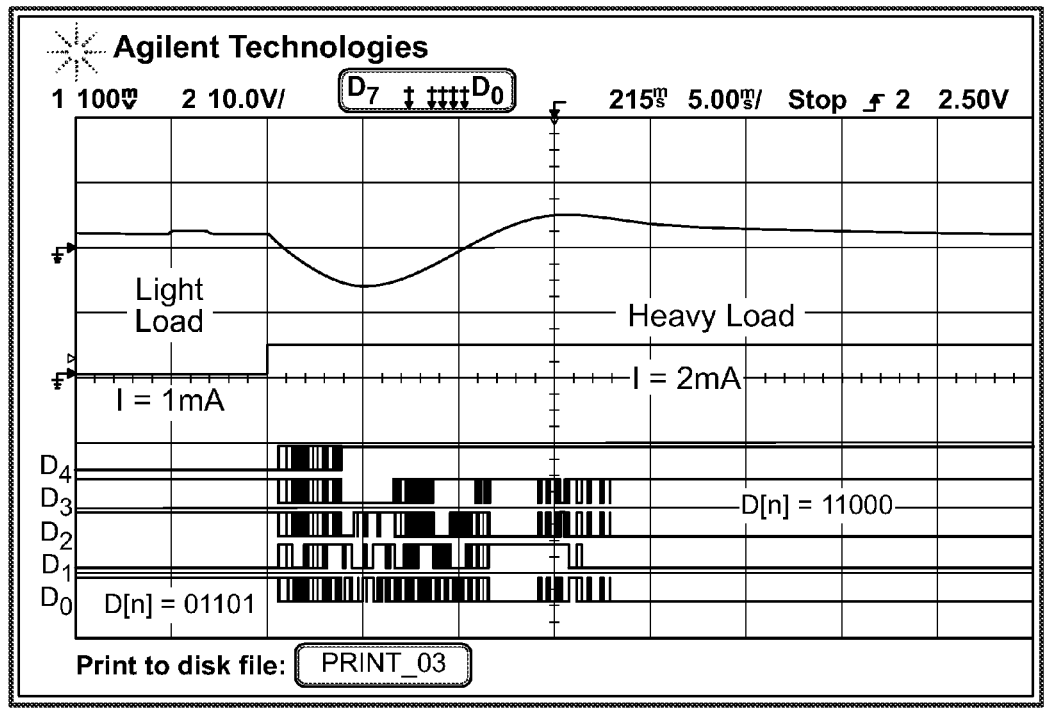

FIG. 3 shows operation of the DPFM/DPAM in open loop, when the 5 most significant bits of the control signal $f_{sw}[n]$ are changing between a low and high value. It can be seen that the change of the control variable effectively changes the switching frequency. FIG. 4 shows results of the closed loop operation of this system when the output load changes between 1 mA and 2 mA. It can be seen that the controller reacts on load change, by changing the control variable $f_{sw}[n]$, which in turns increases the switching frequency. Both of these experimental results verify functionality of the new invention.

Figure 5:
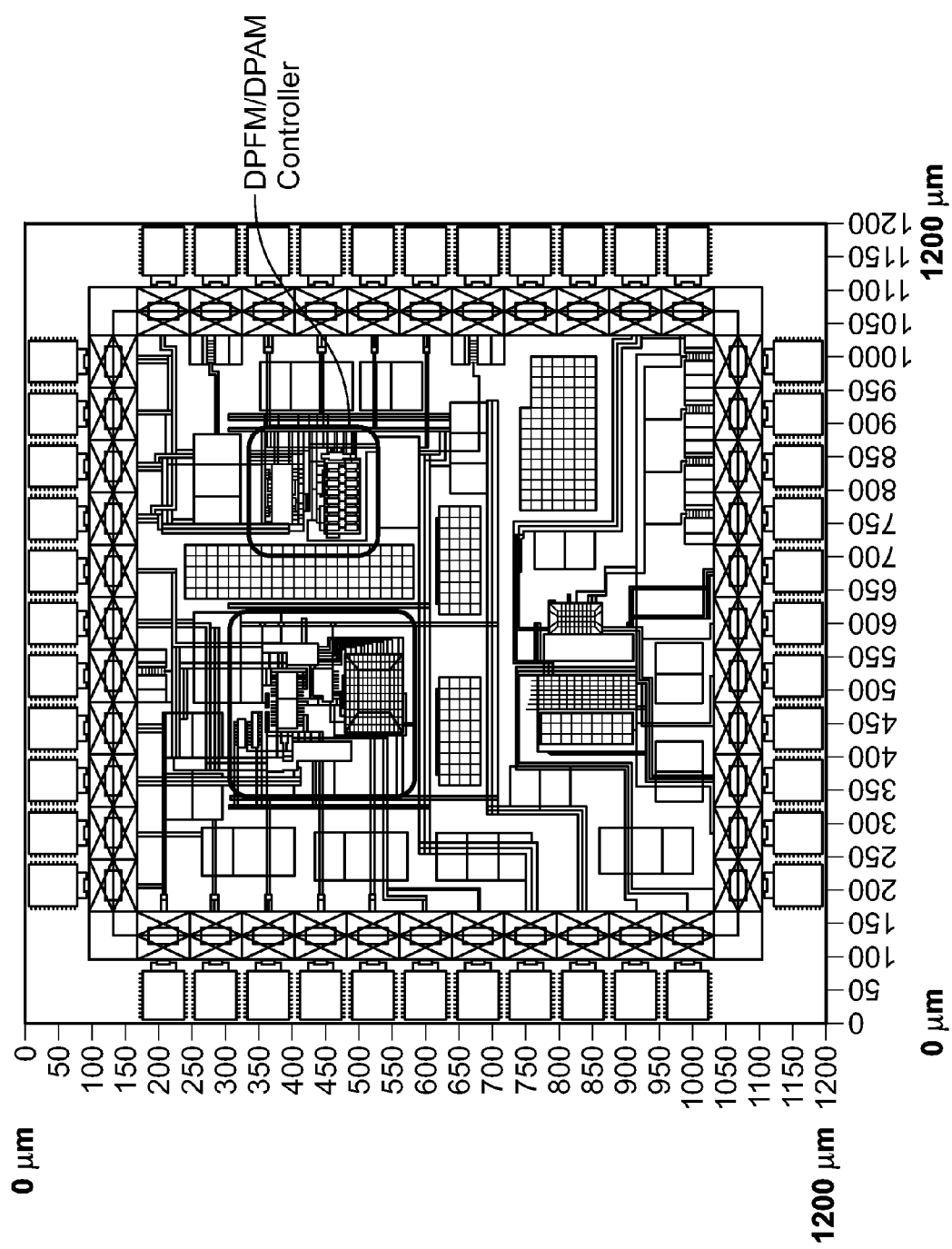
FIG. 5 illustrates a chip layout of one embodiment of the present invention.

To verify low power consumption and possibility of implementation on a small silicon area an application specific IC was designed in 0.18 CMOS technology, as a part of a larger controller IC, and simulated. FIG. 5 and Table 1 show main characteristic of the DPFM/DPAM controller. It can be seen that it takes a very small silicon area of about 0.3 mm², and consumes only 50 µA of current, when connected to a 1.8 V supply.

TABLE I

| Parameters of on-chip implemented DPFM/DPAM controller | | |
|---|---|---|
| Area | Frequency range | Current cons. |
| 0.03 mm² | 20 kHz to 250 kHz | 50 μA |

The foregoing description of preferred embodiments of the present invention has been provided for the purposes of illustration and description. It is not intended to be exhaustive or to limit the invention to the precise forms disclosed. Many embodiments were chosen and described in order to best explain the principles of the invention and its practical application, thereby enabling others skilled in the art to understand the invention for various embodiments and with various modifications that are suited to the particular use contemplated. It is intended that the scope of the invention be defined by the claims and their equivalents.

What is claimed is:

1. A digital modulator comprising:
    a delay line that sets the time on of an output signal of the digital modulator; and
    circuitry to set the period of the output signal of the digital modulator, the circuitry including a ring oscillator with slow delay cells used to set a positive edge of a pulse through the ring oscillator and fast delay cells to set a negative edge of the pulse through the ring oscillator, wherein the pulse width narrows over time; and
    wherein the circuitry includes an end-of-race detector that detects the end of the period and outputs a clock signal.

2. The digital modulator of claim 1, wherein the digital modulator is a Digital Pulse Frequency Monitor (DPFM).

3. The digital modulator of claim 1, wherein the digital modulator is a Digital Pulse Frequency/Pulse Amplitude (DPFM/DPAM).

4. The digital modulator of claim 1, wherein the ring oscillator includes SR latches connected to the fast and slow delay cells.

5. The digital modulator of claim 1, wherein the delay in the delay line is adjustable.

6. The digital modulator of claim 1, wherein the digital modulator does not include a counter.

7. The digital modulator of claim 1, wherein the speed of the pulse narrowing in the ring oscillator is adjustable to adjust the period.

8. The digital modulator of claim 1, wherein the delay of at least one of the slow delay or fast delay cells is adjustable to adjust the period.

9. The digital modulator of claim 1, wherein the delay of the slow delay cells is adjustable to adjust the period.

10. A digital modulator comprising:
    a delay line that sets the time on of an output signal of the digital modulator;
    circuitry to set the period of the output signal of the digital modulator, the circuitry including a ring oscillator with slow delay cells used to set a positive edge of a pulse through the ring oscillator and fast delay cells to set a negative edge of the pulse through the ring oscillator, wherein the pulse width narrows over time; and
    wherein the circuitry includes another delay line which sets the initial pulse width going into the ring oscillator.

11. The digital modulator of claim 10, wherein the delay in another delay line is adjustable.

12. A ring oscillator including:
    slow delay cells used to set a positive edge of a pulse through the ring oscillator and fast delay cells to set a negative edge of the pulse through the ring oscillator, wherein the pulse width narrows over time; and
    further comprising an end-of-race detector that detects the end of a period and outputs a clk signal.

13. The ring oscillator of claim 12 further including SR latches connected to the fast and slow delay cells.

14. The ring oscillator of claim 12, wherein the speed of the pulse narrowing in the ring oscillator is adjustable to adjust the period.

15. The ring oscillator of claim 12, wherein the delay of at least one of the slow delay or fast delay cells is adjustable to adjust the period.

16. The ring oscillator of claim 12, wherein the delay of the slow delay cells is adjustable to adjust the period.

17. A ring oscillator including:
    slow delay cells used to set a positive edge of a pulse through the ring oscillator and fast delay cells to set a negative edge of the pulse through the ring oscillator, wherein the pulse width narrows over time; and
    wherein another delay line sets the initial pulse width going into the ring oscillator.

18. A method of digitally producing a modulated signal comprising:
    setting the time on of an output signal using a delay line;
    setting the period of the output signal using a ring oscillator with slow delay cells to used to set a positive edge of a pulse through the ring oscillator and fast delay cells to set a negative edge of the pulse through the ring oscillator, wherein the pulse width narrows over time;
    detecting an end of the period using an end-of-race detector; and
    outputting a clock signal.

* * * * *